(12) United States Patent
Ehberger et al.

(10) Patent No.: US 11,791,128 B2
(45) Date of Patent: Oct. 17, 2023

(54) METHOD OF DETERMINING THE BEAM CONVERGENCE OF A FOCUSED CHARGED PARTICLE BEAM, AND CHARGED PARTICLE BEAM SYSTEM

(71) Applicant: ICT Integrated Circuit Testing Gesellschaft für Halbleiterprüftechnik mbH, Heimstetten (DE)

(72) Inventors: Dominik Ehberger, Ebersberg (DE); John Breuer, Munich (DE); Matthias Firnkes, Walpertskirchen (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 112 days.

(21) Appl. No.: 17/500,835

(22) Filed: Oct. 13, 2021

(65) Prior Publication Data

US 2023/0116466 A1    Apr. 13, 2023

(51) Int. Cl.
*H01J 37/22*    (2006.01)
(52) U.S. Cl.
CPC ... *H01J 37/222* (2013.01); *H01J 2237/24528* (2013.01)
(58) Field of Classification Search
CPC ............. H01J 37/222; H01J 2237/24528
See application file for complete search history.

(56) References Cited

U.S. PATENT DOCUMENTS

| | | | |
|---|---|---|---|
| 7,714,286 B2 | 5/2010 | Nakano et al. | |
| 9,136,089 B2 | 9/2015 | Wang | |
| 9,666,405 B1 | 5/2017 | Lanio et al. | |
| 11,094,501 B2 | 8/2021 | Firnkes et al. | |
| 11,380,513 B2 | 7/2022 | Kubota | |
| 2003/0001102 A1 | 1/2003 | Zach | |
| 2015/0170876 A1 | 6/2015 | Janssen et al. | |

(Continued)

FOREIGN PATENT DOCUMENTS

| | | |
|---|---|---|
| EP | 1 544 894 A2 | 6/2005 |
| GB | 2 305 324 A | 4/1997 |

(Continued)

OTHER PUBLICATIONS

International Search Report and Written Opinion for Application No. PCT/EP2022/073948, dated Dec. 21, 2022, 16 pages.

(Continued)

*Primary Examiner* — Nicole M Ippolito
*Assistant Examiner* — Hanway Chang
(74) *Attorney, Agent, or Firm* — KILPATRICK TOWNSEND & STOCKTON LLP

(57) ABSTRACT

A method of determining a beam convergence of a charged particle beam (11) focused by a focusing lens (120) toward a sample (10) in a charged particle beam system (100) is provided. The method includes (a) taking one or more images of the sample when the sample is arranged at one or more defocus distances from a respective beam focus of the charged particle beam; (b) retrieving one or more beam cross sections from the one or more images; (c) determining one or more beam widths from the one or more beam cross sections; and (d) calculating at least one beam convergence value based on the one or more beam widths and the one or more defocus distances. Further, a charged particle beam system for imaging and/or inspecting a sample that is configured for any of the methods described herein is provided.

20 Claims, 3 Drawing Sheets

(56) References Cited

U.S. PATENT DOCUMENTS

| | | |
|---|---|---|
| 2016/0254118 A1 | 9/2016 | Kohno |
| 2019/0122854 A1 | 4/2019 | Zotta et al. |
| 2021/0110996 A1 | 4/2021 | Rhinow et al. |
| 2021/0151284 A1 | 5/2021 | Firnkes et al. |

FOREIGN PATENT DOCUMENTS

| | | |
|---|---|---|
| TW | 202101513 A | 1/2021 |
| WO | 2021/078445 A1 | 4/2021 |

OTHER PUBLICATIONS

Reimer, L., "Scanning Electron Microscopy", Physics of Image Formation and Microanalysis, Section 2.4.2 Depth of Focus, Optical Sciences, Second Edition, Springer, Jan. 1, 1998, 4 pages.

International Search Report and Written Opinion for Application No. PCT/EP2022/073953, dated Dec. 21, 2022, 14 pages.

U.S. Appl. No. 17/500,842 Notice of Allowance dated Apr. 18, 2023, 8 pages.

METHOD OF DETERMINING THE BEAM CONVERGENCE OF A FOCUSED CHARGED PARTICLE BEAM, AND CHARGED PARTICLE BEAM SYSTEM

TECHNICAL FIELD

Embodiments described herein relate to methods of determining a beam convergence of a charged particle beam focused by a focusing lens toward a sample in a charged particle beam system, particularly in a scanning electron microscope (SEM). Specifically, the numerical aperture (NA) provided by a focusing lens in a charged particle beam system can be determined from one or more taken images of a sample according to the methods described herein. Embodiments further relate to charged particle beam systems for inspecting and/or imaging a sample that is configured for any of the methods described herein.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Inspection apparatuses using charged particle beams such as scanning electron microscopes (SEM) have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and/or inspect a sample.

Reliably inspecting and/or imaging samples with a charged particle beam system at a good resolution is, however, challenging. Specifically, the charged particle beam typically suffers from beam aberrations that limit the resolution, and the actual cross-sectional shape of a focused charged particle beam may be different from the design shape. The resolution limit of a charged particle beam system is determined by the numerical aperture (NA) of the charged particle beam that is focused by an objective lens on a surface of the sample.

The numerical aperture (NA) of a charged particle beam is a magnitude that is typically used by the skilled person to describe the beam convergence of the charged particle beam focused on the sample surface by the objective lens. A large numerical aperture provides an improved resolution limit that can theoretically be reached if beam aberrations are low. The system may be designed for a specific numerical aperture that provides an excellent operation, but the actual numerical aperture may deviate from the expected value. Therefore, knowledge of the beam convergence of a charged particle beam focused by a focusing lens, and more specifically knowledge of the actual numerical aperture of the charged particle beam, would be beneficial for determining sources of beam aberrations and for improving the resolution of the system.

In view of the above, it would be beneficial to accurately and reliably determine the beam convergence of a charged particle beam focused by a focusing lens in a charged particle beam system, in particular to accurately determine the numerical aperture of the charged particle beam focused by the objective lens. Further, it would be beneficial to provide a charged particle beam system for inspecting and/or imaging a sample that is configured for being operated in accordance with any of the methods described herein.

SUMMARY

In light of the above, methods of determining a beam convergence of a charged particle beam and charged particle beam systems configured therefor are provided according to the independent claims.

According to a first aspect, a method of determining a beam convergence of a charged particle beam focused by a focusing lens toward a sample in a charged particle beam system is provided. The method includes: (a) taking one or more images of the sample when the sample is arranged at one or more defocus distances from a respective beam focus of the charged particle beam; (b) retrieving one or more beam cross sections from the one or more images; (c) determining one or more beam widths from the one or more beam cross sections; and (d) calculating at least one beam convergence value based on the one or more beam widths and the one or more defocus distances.

In some embodiments, the at least one beam convergence value contains information about a change of beam width as a function of defocus distance. In particular, the at least one beam convergence value may contain or be the numerical aperture (NA) of the charged particle beam.

In some embodiments, also a focus image of the sample is taken (when the sample is arranged at the focal distance from the focusing lens), and said focus image of the sample can be used in (b) for retrieving the one or more beam cross sections from the one or more images taken out of focus in (a). A focus image of the sample can also be otherwise known and can then be used for the retrieval of the one or more beam cross sections in (b). Alternatively, the one or more beam cross sections can be retrieved in (b) without using a focus image of the sample.

According to another aspect, a charged particle beam system for imaging and/or inspecting a sample with a charged particle beam, particularly with an electron beam, is provided. The charged particle beam system includes a charged particle source for emitting a charged particle beam propagating along an optical axis, a sample stage, a focusing lens for focusing the charged particle beam toward a sample placed on the sample stage, a charged particle detector for detecting signal particles emitted from the sample, and a processor and a memory storing instructions that, when executed by the processor, cause the system to perform any of the methods described herein.

In particular, the stored instruction, when executed, may cause the system to (x1) to retrieve one or more beam cross sections from one or more images of the sample taken at one or more defocus distances; (x2) to determine one or more beam widths from the one or more beam cross sections; and (x3) to calculate at least one beam convergence value based on the one or more beam widths and the one or more defocus distances.

Embodiments are also directed at apparatuses for carrying out the disclosed methods and include apparatus parts for performing the individual method actions. The described method may be performed by way of hardware parts, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
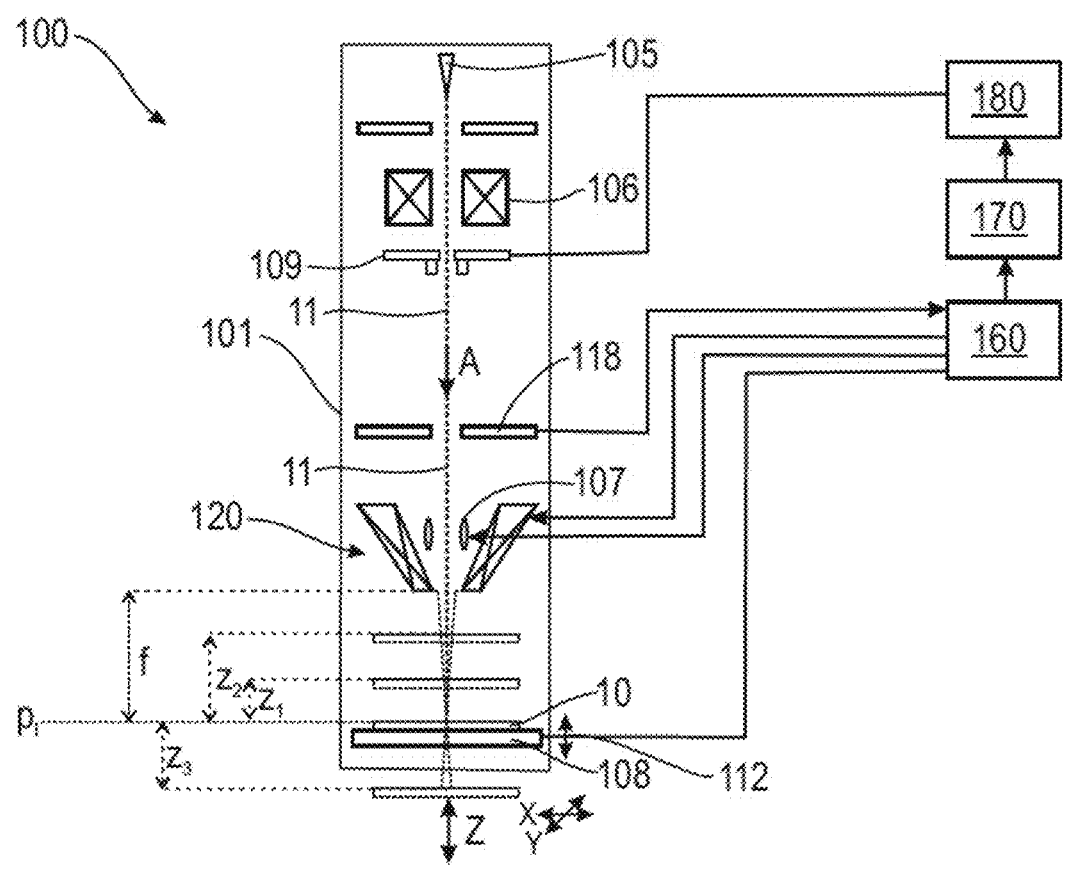
FIG. 1 shows a schematic view of a charged particle beam system according to embodiments described herein that is adapted for being operated according to any of the methods described herein.

FIG. 1 is a schematic view of a charged particle beam system 100 for inspecting and/or imaging a sample 10 according to embodiments described herein. The charged particle beam system 100 includes a charged particle source 105, particularly an electron source, for emitting a charged particle beam 11, particularly an electron beam, propagating along an optical axis A. The charged particle beam system 100 further includes a sample stage 108, and a focusing lens 120, particularly an objective lens, for focusing the charged particle beam 11 on the sample 10 that is placed on the sample stage 108. The charged particle beam system 100 further includes a charged particle detector 118, particularly an electron detector, for detecting signal particles (in particular, secondary electrons and/or backscattered electrons) emitted from the sample 10.

An image generation unit 160 may be provided for generating one or more images of the sample 10 based on the charged particle signal received from the charged particle detector 118. The image generation unit 160 can forward the one or more images of the sample to a processing unit 170 that is configured to determine at least one beam convergence value of the charged particle beam in accordance with the methods described herein.

Optionally, the at least one beam convergence value may be used for determining beam aberrations of the charged particle beam. For example, a set of beam aberration coefficients may be determined in an iterative process that uses the beam convergence value as an input parameter. The beam aberration coefficients can be forwarded to a controller 180 of an aberration corrector 109, such that the aberration corrector 109 can be adjusted appropriately for compensating one or more beam aberrations that are present in the system. An aberration-corrected charged particle beam can be provided.

The sample stage 108 may be a movable stage. In particular, the sample stage 108 may be movable in the Z-direction, i.e., in the direction of the optical axis A, such that the distance between the focusing lens 120 and the sample 10 can be varied (see arrow 112 in FIG. 1). By moving the sample stage 108 in the Z-direction, the sample 10 can be moved to different defocus distances, i.e., away from a focal plane $p_f$ of the focusing lens 120 such that out-of-focus images of the sample 10 can be taken by a respective stage movement, e.g. in predetermined increments.

In some embodiments, the sample stage 108 may also be movable in a plane perpendicular to the optical axis A (also referred to herein as the X-Y-plane). By moving the sample stage 108 in the X-Y-plane, a specified surface region of the sample 10 can be moved into an area below the focusing lens 120, such that the specified surface region can be imaged by focusing the charged particle beam 11 thereon.

The beam-optical components of the charged particle beam system 100 are typically placed in a vacuum chamber 101 that can be evacuated, such that the charged particle beam 11 can propagate along the optical axis A from the charged particle source 105 toward the sample stage 108 and hit the sample 10 under a sub-atmospheric pressure, e.g. a pressure below $10^{-3}$ mbar or a pressure below $10^{-5}$ mbar.

In some embodiments, the charged particle beam system 100 may be an electron microscope, particularly a scanning electron microscope. A scan deflector 107 may be provided for scanning the charged particle beam 11 over a surface of the sample 10 along a predetermined scanning pattern, e.g., in the X-direction and/or in the Y-direction.

In some embodiments, a condenser lens system 106 may be arranged downstream of the charged particle source 105, particularly for collimating the charged particle beam 11 propagating toward the focusing lens 120. In some embodiments, the focusing lens 120 is an objective lens configured to focus the charged particle beam 11 on the sample 10, particularly a magnetic objective lens, an electrostatic magnetic lens, or a combined magnetic-electrostatic lens. The objective lens may optionally include a retarding field device, e.g. one or more retarding electrodes, configured to decelerate the charged particle beam to a predetermined landing energy on the sample.

One or more surface regions of the sample 10 can be inspected and/or imaged with the charged particle beam system 100. The term "sample" as used herein may relate to a substrate, e.g., with one or more layers or features formed thereon, a semiconductor wafer, a glass substrate, a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

For inspecting the sample 10 with the charged particle beam 11, the charged particle beam 11 is typically focused on a sample surface with the focusing lens 120. Secondary electrons and/or backscattered electrons are emitted from the sample when the charged particle beam 11 impinges on the sample surface. The signal electrons provide information about spatial characteristics and dimensions of features of the sample and can be detected with the charged particle detector 118. By scanning the charged particle beam 11 over the sample surface, e.g. with the scan deflectors 107, and detecting the signal electrons as a function of the generation position of the signal electrons, the sample surface or a portion thereof can be imaged, e.g., with the image generation unit 160 that may be configured to provide an image of the sample 10 based on the received signal electrons.

A small spot of the focused charged particle beam 11 on the sample surface increases the obtainable image resolution. Accordingly, the sample surface should be arranged in the focal plane $p_I$ of the focusing lens 120 during the inspection, in order to obtain a sharp in-focus image of the sample 10. A sharp image of the sample 10 taken in-focus is also referred to herein as a "focus image $h_I$", the subscript I designating "In focus". Similarly, the beam cross section of the charged particle beam 11 in the focal plane $p_I$ is referred to herein as a "focus beam cross section $g_I$", the subscript I designating "In focus".

Notably, an image can be mathematically presented in real space (=in the image domain, i.e. as a function of the spatial coordinates) or in Fourier space (=in the frequency domain, i.e. as a function of spatial frequency). An image in Fourier space can be calculated from an image in real space via a Fourier transformation (FT). Both above representations contain corresponding information of the image. As used herein, images in real space are designated with the small letter "$h_n$" and images in Fourier space are designated by the capital letter "$H_n$", the subscript "n" designating an $n^{th}$ taken image. For example, while "$h_I$" designates the focus image of the sample in real space, "$H_I$" designates the focus image of the sample in Fourier space, which is a Fourier transform of $h_I$. Similarly, beam cross sections in real space are designated herein with the small letter "$g_n$", and beam cross sections in Fourier space are designated herein by the capital letter "$G_n$", the subscript "n" designating the beam cross section of the $n^{th}$ taken image. For example, while "$g_I$" designates the focus beam cross section of the charged particle beam in real space, "$G_I$" designates the focus beam cross section of the charged particle beam in Fourier space, which is a Fourier transform of $g_I$. Images and beam cross sections in real space can be Fourier transformed into Fourier space, and vice versa, via a fast Fourier transform (FFT) algorithm in some of the embodiments described herein.

The actual value of the beam convergence of the charged particle beam focused by the focusing lens 120 onto the sample is typically unknown in charged particle beam systems. The beam convergence may be expressed in terms of the beam convergence angle (a) relative to the optical axis or in terms of the numerical aperture (NA) of the charged particle beam, which values are difficult to determine being "longitudinal properties" of the beam that are hidden and not directly available from an image. The numerical aperture (NA) determines the resolution limit, such that knowledge of the actual value of the numerical aperture would be highly valuable.

For example, the numerical aperture of a system is often used for adapting and designing the beam influencing elements (such as the objective lens) of the system, which may lead to inaccuracies and beam aberrations in the event that the numerical aperture that is actually present in the charged particle beam system deviates from the design numerical aperture that was assumed for the system design. Beam influencing elements may include one or more elements of the group consisting of: a lens, a beam extractor, a beam deflector, a collimator, an aberration corrector, a scan deflector, a beam separator, and a charged particle detector. Therefore, determining the actual numerical aperture can be helpful for identifying sources of inaccuracies in the system and for optimizing the system design and the resolution. Also, the numerical aperture as a magnitude that expresses the beam convergence can be used as an input parameter in an aberration coefficient determination routine.

According to methods described herein, at least one beam convergence value of the charged particle beam, particularly the numerical aperture (NA), can be reliably and accurately determined. The charged particle beam system 100 of FIG. 1 may include a processor and a memory (shown in FIG. 1 as the processing unit 170) storing instructions that, when executed by the processor, cause the system to perform any of the methods described herein.

Figure 2:
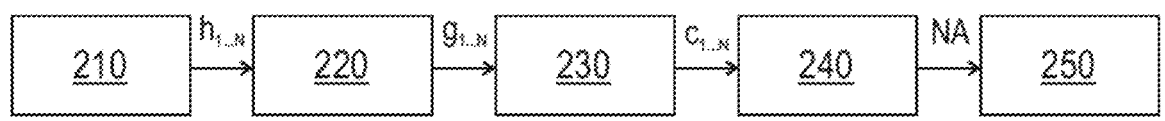
FIG. 2 shows a flow diagram illustrating a method of determining a beam convergence of a charged particle beam according to embodiments described herein.
Figure 3:
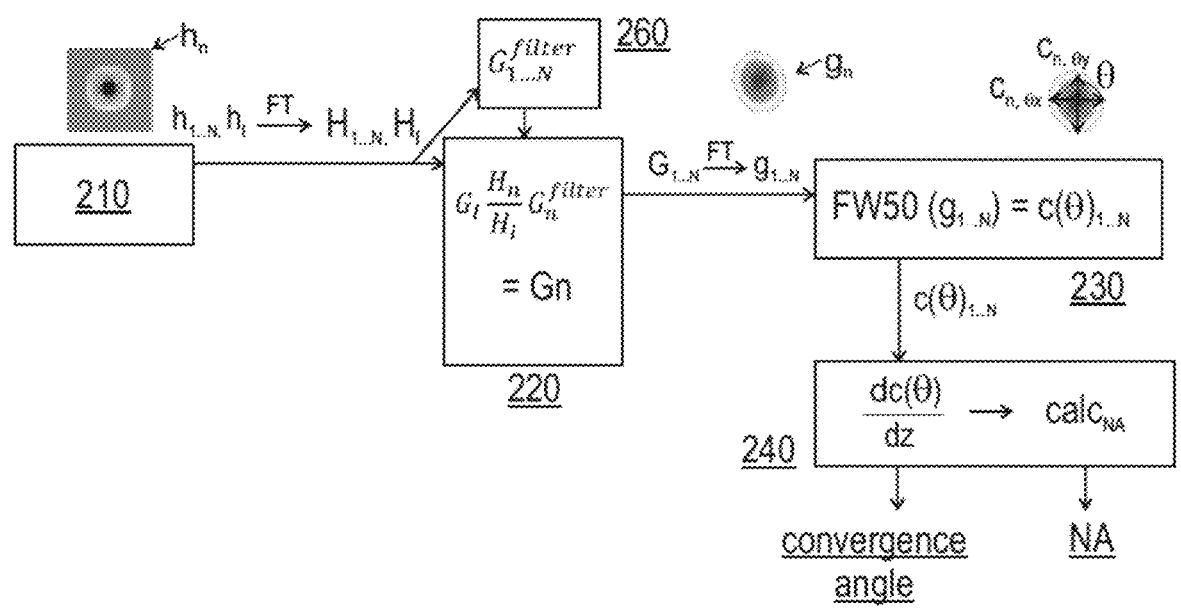
FIG. 3 shows a more detailed diagram illustrating a method as shown in FIG. 2.

FIG. 2 and FIG. 3 are flow diagrams that schematically illustrate such a method of determining at least one beam convergence value. The diagram of FIG. 3 shows optional further details as compared to the more general diagram of FIG. 2.

In box 210 of FIG. 2 and FIG. 3, one or more images ($h_{1...N}$) of the sample are taken when the sample is arranged at one or more defocus distances ($z_{1...N}$) from a respective beam focus of the charged particle beam. A defocus distance is understood herein as the distance ($\neq 0$) between the sample and the beam focus when an image is taken. If an image is taken when the sample is arranged at a defocus distance of the sample relative to the beam focus, the resulting image is an out-of-focus image of the sample. Naturally, an increased defocus distance leads to an increased blurring of the respective taken image, because the beam cross section generally increases and the resolution generally decreases with the defocus distance.

In some embodiments, a plurality of images, e.g. two, three, six or more images, are taken at a plurality of different defocus distances between the sample and the respective beam focus, e.g., at two, three, six or more different defocus distances. Specifically, at least one image of the sample may be taken at an overfocus distance, i.e. at a defocus setting in which the sample is arranged further away from the focusing lens 120 than the respective beam focus of the charged particle beam (see defocus distance $z_3$ illustrated in FIG. 1). Further, at least one image of the sample may be taken at an underfocus distance, i.e. at a defocus setting in which the sample is arranged closer to the focusing lens 120 than the respective beam focus of the charged particle beam (see defocus distances $z_1$ and $z_2$ illustrated in FIG. 1). An image taken at a first defocus distance $z_1$ is designated herein as $h_1$, and an image taken at an $n^{th}$ defocus distance $z_n$ is designated herein as $h_n$. A total of N images may be taken, designated herein as ($h_{1...N}$), in particular N being six or more, e.g., ten or more, or fifteen or more.

In some embodiments described herein, the one or more defocus distances ($z_{1...N}$) where the one or more images ($h_{1...N}$) are taken are known quantitatively, i.e., in absolute values, or—if a plurality of images are taken at a plurality of different defocus distances—at least the differences between respective two defocus distances of the plurality of defocus distances are known quantitatively, e.g. in [µm] or in another length unit. For determining the beam convergence from one or more defocus images, it is beneficial to know quantitatively at which defocus distance (e.g., in [µm]) each of said defocus images has been taken. Alternatively, for determining the beam convergence from two (or more) defocus images taken at two (or more) different defocus distances, it is beneficial to know quantitatively at least the differences between two respective different defocus distances (e.g., in [µm]). In some embodiments, a calibration may be conducted before the defocus images of the sample are taken, such that each defocus distance where an image is taken is quantitatively known from the respective setting of the charged particle beam system.

In some embodiments, which can be combined with other embodiments, the defocus distance is varied by moving the sample stage 108 relative to the focusing lens 120 in the Z-direction, i.e. along the optical axis A. A stage movement for varying between a plurality of different defocus distance is schematically depicted in FIG. 1. For example, the sample stage may be moved in predetermined increments, e.g. in a plurality of equal or similar increments of between 0.2 µm and 2 µm, and an image of the sample may be taken at each of the plurality of defocus distances. A constant focal strength of the focusing lens 120 may be maintained while the sample stage is moved and the images are taken.

In other embodiments, the defocus distance is varied by varying a focusing strength of the focusing lens 120. An increased focusing strength of the focusing lens shifts the respective beam focus and the focal plane relative to the sample toward the focusing lens, and a decreased focusing strength shifts the respective beam focus and the focal plane relative to the sample away from the focusing lens, such that the defocus distance is varied by shifting the focal plane $p_I$ relative to the sample 10. The sample may remain stationary. In particular, a plurality of different focusing strengths may be applied on the charged particle beam by the focusing lens 120 for varying between the plurality of different defocus distances, and an image may be taken at each of the plurality of different focusing strengths.

Notably, a focusing strength variation also changes the beam convergence. Therefore, in embodiments described herein, the focusing strength—if varied—is varied only such that the resulting change of defocus distance is negligible relative to the total focal length (f) of the focusing lens 120. For example, the defocus distance may be varied within a total range of several microns (e.g., <10 µm) by varying the focusing strength for taking the plurality of images (see FIG. 4), whereas the total focal length (f) of the focusing lens 120 may be in the range of several millimeters or even several centimeters. Therefore, the beam convergence may only be changed in a negligible manner by varying the focusing strength of the focusing lens according to embodiments described herein, and the determined numerical aperture (NA) or further beam convergence values are not substantially affected.

In some embodiments, a defocus distance variation as a function of a focusing strength variation of the focusing lens 120 is known in advance or is determined in a preceding calibration, such that, for each focusing strength variation applied by the focusing lens, the respective defocus distance variation is known quantitatively, or for each focusing strength of the focusing lens the respective defocus distance is quantitatively known (e.g., in [µm]).

Returning now to FIG. 2 and FIG. 3, in box 220, one or more beam cross sections ($g_{1 \ldots N}$) of the charged particle beam at the one or more defocus distances ($z_{1 \ldots N}$) are retrieved from the one or more images ($h_{1 \ldots N}$). In particular, a plurality of beam cross sections are retrieved from the plurality of images, namely one retrieved beam cross section for each of the plurality of images. Each retrieved beam cross section corresponds to the beam cross section of the charged particle beam at the defocus distance where the respective image is taken. Out-of-focus beam profiles can be extracted from out-of-focus images via several different beam profile extraction methods. One exemplary beam profile extraction method is exemplarily explained in the following.

A focus image ($h_I$) of the sample can be taken in addition to the one or more images ($h_{1 \ldots N}$) that are taken out of focus, and said focus image ($h_I$) can be used for retrieving the one or more beam cross sections ($g_{1 \ldots N}$) from the one or more images ($h_{1 \ldots N}$). The focus image $h_I$ of the sample can also be otherwise known, for example, because a sample with a known geometry is used for determining the beam convergence according to the methods described herein.

More specifically, as is depicted in further detail in box 220 of FIG. 3, retrieving the one or more beam cross sections ($g_{1 \ldots N}$) from the one or more images ($h_{1 \ldots N}$) may include Fourier transforming the one or more taken images in real space ($h_{1 \ldots N}$) to provide the one or more taken images in Fourier space ($H_{1 \ldots N}$), and dividing the one or more taken images in Fourier space ($H_{1 \ldots N}$) by the focus image of the sample in Fourier space ($H_I$). The above beam profile extraction method is based on the fact that, in Fourier space, dividing a taken defocus image ($H_n$) of a sample by the focus image ($H_I$) of the sample removes the structure of the sample, such that said division may yield the pure beam profile, i.e. the beam cross section without sample information. Each retrieved beam cross section in Fourier space ($G_n$) may be inversely Fourier transformed for obtaining the respective retrieved beam cross section in real space ($g_n$).

As is further illustrated in box 220 of FIG. 3, retrieving the one or more beam cross sections ($g_{1 \ldots N}$) from the one or more taken images ($h_{1 \ldots N}$) may optionally include at least one of a multiplication with an adaptive filter term $G_{1 \ldots N}^{Filter}$ and a multiplication with a focus beam cross section in Fourier space ($G_I$). The adaptive filter term $G_{1 \ldots N}^{Filter}$ can be provided by an adaptive filter 260 that may receive the taken images as an input information. An adaptive filter term may be provided individually for each of the taken images by the adaptive filter 260. Without the adaptive filter term $G_{1 \ldots N}^{Filter}$, close-to-zero values of the focus image $H_I$ in the denominator of the above division may lead to an overly strong weight of noise in the focus image. The adaptive filter term $G_{1 \ldots N}^{Filter}$ can reduce or avoid such unwanted effects of noise in the focus image $H_I$ in the calculation of the focus beam cross sections ($G_{1 \ldots N}$). A respective filter term may be determined by the adaptive filter 260 for each of the images ($h_{1 \ldots N}$) individually, for example in order to make sure that for each image and the respective noise in the image an appropriate filter term is used.

A focus beam cross section in real space ($g_I$) or in Fourier space ($G_I$) can be simulated, e.g., based on a wave optical simulation of the beam cross section in focus. For example, a Gaussian beam cross section can be assumed in the focal plane of the focusing lens 120 for a simulation of the focus beam cross section $g_I$. Specifically, the focus beam cross section $g_I$ of the charged particle beam can be determined from a resolution measurement, assuming, e.g., a Gaussian beam profile.

In box 230, one or more beam widths ($c_{1 \ldots N}$) of the charged particle beam at the one or more defocus distances ($z_{1 \ldots N}$) are determined from the one or more beam cross sections ($g_{1 \ldots N}$). In particular, a plurality of beam widths are determined from the plurality of beam cross sections, one retrieved beam width (e.g., in one or more directions, i.e., for one or more azimuthal angles) for each of the plurality of beam cross sections.

In some embodiments, one beam width may be retrieved from each beam cross section in box 230. For example, the one or more beam cross sections ($g_{1...N}$) may be essentially rotationally symmetric, e.g. circular or Gaussian, such that it is anyway sufficient to retrieve only one beam width from each beam cross section, because the beam width is essentially the same at each azimuthal angle. "Azimuthal angles" as used herein refer to different directions within the cross-sectional planes of the beam cross sections, i.e. different directions perpendicular to the optical axis (A) where the width of a beam cross section can be measured. Alternatively, even if a beam cross section is not rotationally symmetric, one beam width for the beam cross section can be determined as an average beam width or as an FW50-value, which is the diameter of a circle around the optical axis A through which half of the beam current propagates.

In some embodiments, which can be combined with other embodiments, each of the one or more beam widths ($c_{1...N}$) is determined in two or more directions, i.e. at two or more different azimuthal angles. In particular, each of the one or more beam widths ($c_{1...N}$) can be determined as a function of azimuthal angle (($c_{1...N}$)(θ)). FIG. 3 exemplarily shows a beam cross section $g_n$ retrieved from an image $h_n$ that is not exactly rotationally symmetric. The respective beam width $c_n$ can be determined in two or more directions, for example at an azimuthal angle $θ_x$ (=in the X-direction) and at an azimuthal angle $θ_y$ (=in the y-direction). Specifically, the beam width $c_n$ can be retrieved from the beam cross section $g_n$ as a function of azimuthal angle ($c_n(θ)$).

In some embodiments, which can be combined with other embodiments described herein, at least one magnitude of the following group is determined from each beam cross section and is considered as the respective beam width: (1) FWHM (=full width at half maximum) at one or more azimuthal angles, or an average FWHM; (2) FW50 (=full width 50) at one or more azimuthal angles, or an average FW50, also referred to as D50-width; (3) $1/e^2$-width; and (4) another commonly used magnitude that describes the beam width. The beam radius or the beam diameter may be considered as the beam width, respectively. Notably, depending on the magnitude that is retrieved as the beam width in box 230, the resulting beam convergence value may need to be multiplied with a respective calibration factor (K) for determining the correct value of the numerical aperture therefrom.

In box 240, the at least one beam convergence value is calculated based on the one or more beam widths ($c_{1...N}$) and the one or more defocus distances ($z_{1...N}$). In some embodiments, the at least one beam convergence value may be or may include a change of beam width as a function of defocus distance $$\left(\frac{dc}{dz}\right)$$

and/or the beam convergence angle (a) calculated therefrom, for example in [degrees] or in [rad]. For example, an average beam width variation as a function of defocus distance may be determined and the beam convergence angle (a) may be calculated therefrom. If at least one image is taken at an overfocus distance and at least one image is taken at an underfocus distance, the average change of beam width as a function of defocus distance can be separately determined in front of the focal plane and behind the focal plane. An average beam convergence angle (a) can be calculated therefrom and be considered as at least one beam convergence value.

Figure 4:
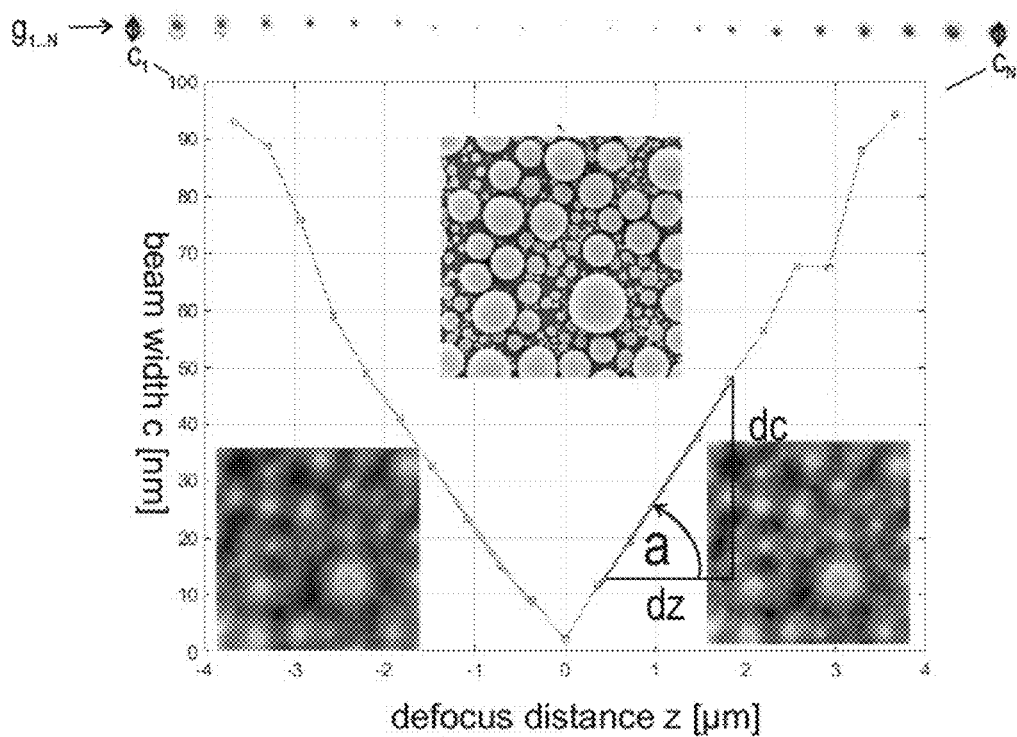
FIG. 4 is a graph showing a beam width as a function of a defocus distance determined using any of the methods described herein.

FIG. 4 shows a graph of the beam width (c) as a function of defocus distance (f) in an exemplary defocus range from −4 μm to +4 μm relative to the beam focus. Here, ten images are taken at different (quantitatively known) underfocus distances, and ten images are taken at different (quantitatively known) overfocus distances, and the respective beam widths are retrieved therefrom. The beam widths $c_{1...N}$ determined in box 230 are shown as small squares at the respective defocus distances $z_{1...N}$. In said graph, the change of beam width as a function of defocus distance $$\left(\frac{dc}{dz}\right)$$

corresponds to the slope or a line that connects the beam widths (or a linear fit thereto). Typically, the absolute values of the slopes upstream and downstream of the beam focus (z=0) essentially correspond to each other, because the charged particles of the beam propagate along essentially linear paths. Nevertheless, it is possible to separately calculate the slope for the overfocus distances and the underfocus distances, as is schematically depicted in FIG. 4.

In some embodiments, an average slope, in particular the slope of a linear fit to at least some of the beam width values depicted as a function of defocus distance, is determined, and the beam convergence angle (a) can be calculated therefrom. The (averaged or fitted) slope value and/or the beam convergence angle (a) calculated therefrom can be determined as the at least one beam convergence value in some of the embodiments described herein.

In some embodiments, the numerical aperture (NA) of the charged particle beam is calculated from the above (averaged or fitted) slope value by multiplying the slope value $$\left(\frac{dc}{dz}\right)$$

with a calibration factor (K). The calibration factor (K) may take into account the magnitude that is used in box 230 as the beam width. In some embodiments, the numerical aperture is calculated as follows: NA=K·|slope(FW50)|, if "FW50" is used as the magnitude for expressing the beam width and "slope" is the (optionally, averaged or linearly fitted) absolute value of $$\left(\frac{dc}{dz}\right),$$

wherein the calibration factor (K) is a value between 0.5 and 1, particularly a value between 0.70 and 0.85.

The resulting numerical aperture NA of the charged particle beam (particularly after multiplication with said calibration factor) can then directly be used as an input parameter in various simulation and design programs for charged particle beam systems that expect the numerical aperture provided by the objective lens as an input parameter.

In some embodiments, which can be combined with other embodiments described herein, the method may further include modifying at least one beam influencing element based on the at least one beam convergence value, in particular based on the determined numerical aperture of the charged particle beam, for tailoring the charged particle beam.

In some embodiments, which can be combined with other embodiments described herein, the method may further include determining one or more beam aberration coefficients of the charged particle beam by an iterative fitting routine that uses the at least one beam convergence value as an input parameter. Such an iterative fitting routine for determining one or more beam aberration coefficients that uses the actual numerical aperture of the charged particle beam as an input parameter is depicted by box 250 in FIG. 2. If the actual numerical aperture NA of the charged particle beam is known, such a fitting routine may be able to more quickly converge toward the actual beam aberration coefficients.

In some embodiments, which can be combined with other embodiments described herein, each of the one or more beam widths ($c_{1\ldots N}$) is determined at two or more azimuthal angles, particularly as a function of azimuthal angle (($c_{1\ldots N}$)($\theta$)), and respective beam convergence values may be calculated at each of said azimuthal angles.

In particular, the at least one beam convergence value may include a first beam convergence value of the charged particle beam at a first azimuthal angle ($\theta x$) and a second beam convergence value of the charged particle beam at a second azimuthal angle ($\theta y$). In some embodiments, the at least one beam convergence value can be calculated as a function of the azimuthal angle, for example if the beam profile is highly asymmetric, oval, or otherwise distorted.

In some embodiments, the numerical aperture of the charged particle beam can be calculated at two or more azimuthal angles, particularly as a function of azimuthal angle (NA($\theta$)). For example, a beam convergence angle (a) or a slope $$\left(\frac{dc}{dz}\right)$$

may first be calculated as a function of the azimuthal angle, and the numerical aperture as a function of the azimuthal angle may be calculated therefrom, particularly based on a multiplication with a calibration factor (K).

A 3-dimensional model of the focused charged particle beam can be generated and/or displayed, in particular if the beam convergence value is determined as a function of azimuthal angle. Alternatively or additionally, one or more two-dimensional representations of the charged particle beam in one or more selected azimuthal planes can be generated and/or displayed. Alternatively or additionally, one or more one-dimensional representations of a beam width of the charged particle beam as a function of the defocus distance can be generated and/or displayed. Alternatively or additionally, the numerical aperture can be determined and/or displayed, e.g. in a one-dimensional representation, as a function of azimuthal angle.

In some embodiments described herein, one single taken defocus image $h_n$ may already be sufficient for determining the at least one beam convergence value therefrom, particularly if the defocus distance $z_n$ where the one single taken defocus image is taken is known quantitatively (and, in addition, the focus image $h_f$ of the sample is taken or is otherwise known, such that the beam cross section $g_n$ and the beam width $c_n$ can be retrieved from the one single taken defocus image $h_n$). Specifically, the at least one beam convergence value can be determined calculating $c_n/z_n$, and the NA can be calculated therefrom. However, a more accurate beam convergence value and a more accurate NA-value can be determined, if a plurality of defocus images $h_{1\ldots N}$ is taken at a plurality of different defocus distances $z_{1\ldots N}$, and the quantity dc/dz is determined therefrom as explained herein (e.g., as an average slope value or as a linear fit to the beam widths as a function of the defocus distance), particularly both in underfocus and in overfocus.

Notably, known processes for determining beam aberration coefficients are based on the analysis of probe shapes retrieved from defocus images taken out-of-focus. However, only relative estimates about beam aberration coefficients are made from the retrieved probe shapes, without quantitatively knowing about the defocus distances at which the defocus images are actually taken. Therefore, known processes cannot be used for retrieving quantitative information about a convergence of a focused charged particle beam. In contrast thereto, methods described herein are based on the realization that defocus images, if taken at quantitatively known defocus distances or at quantitatively known differences therebetween, can be used for retrieving information about the beam convergence angle and, therefore, can be used for determining the actual numerical aperture value of a focused charged particle beam.

The numerical aperture of a charged particle beam focused by a focusing lens is a valuable quantity that has hitherto been determined based on resolution measurements, making assumptions about the actual beam shape, which however leads to determination inaccuracies. According to methods described herein, the NA can be retrieved from actual out-of-focus beam cross sections retrieved from defocus images, such that no assumptions about the beam shape need to be taken. Specifically, no assumptions about beam cross sections or the sample need to be made, which leads to more accurate values of the numerical aperture. Further, the numerical aperture can be determined at an arbitrary azimuthal angle, which has not been possible before, and which allows the identification of (intentional or unintentional) discrepancies between the intended beam shape and the actual beam shape along different directions. Further, the beam shape can be visualized in 3D and/or 2D, which may help in analyzing and improving/tailoring the charged particle beam as appropriate.

Being able to precisely determine the numerical aperture in a charged particle beam system particularly allows for (1) reproducibility and matching, as the numerical aperture is the decisive quantity in determining the obtainable resolution, (2) analysis of beam influencing elements, e.g. for improving future designs, (3) determination of beam aberrations which scale to various powers of the numerical aperture, (4) generating tailored charged particle beams for certain critical dimensioning and defect review tasks, e.g. for inspecting deep trenches in the sample elongated along only one axis.

Specifically, the following embodiments are described herein:

Embodiment 1: A method of determining a beam convergence of a charged particle beam (11) focused by a focusing lens (120) toward a sample (10) in a charged particle beam system (100), comprising: (a) taking one or more images ($h_{1\ldots N}$) of the sample when the sample is arranged at one or more defocus distances ($z_{1...N}$) from a respective beam focus of the charged particle beam; (b) retrieving one or more beam cross sections ($g_{1...N}$) from the one or more images ($h_{1...N}$); (c) determining one or more beam widths ($c_{1...N}$) from the one or more beam cross sections ($g_{1...N}$); and (d) calculating at least one beam convergence value based on the one or more beam widths ($c_{1...N}$) and the one or more defocus distances ($z_{1...N}$).

Embodiment 2: The method of embodiment 1, wherein the one or more defocus distances ($z_{1...N}$) where the one or more images ($h_{1...N}$) are taken, or differences between the one or more defocus distances ($z_{1...N}$), are known in absolute values, and said absolute values are used for calculating the at least one beam convergence value in (d).

Embodiment 3: The method of embodiment 1 or 2, wherein the at least one beam convergence value comprises a change in beam width as a function of defocus distance $$\left(\frac{dc}{dz}\right).$$

Embodiment 4: The method of any of embodiments 1 to 3, wherein the at least one beam convergence value comprises a numerical aperture (NA) of the charged particle beam.

Embodiment 5: The method of any of embodiments 1 to 4, wherein, in (a), a plurality of images are taken when the sample is arranged at a plurality of different defocus distances; in (b), a plurality of beam cross sections are retrieved from the plurality of images; in (c), a plurality of beam widths are determined from the plurality of beam cross sections; and in (d), the at least one beam convergence value is calculated based on the plurality of beam widths and the plurality of defocus distances.

Embodiment 6: The method of embodiment 5, wherein a numerical aperture (NA) of the charged particle beam is calculated based on an averaged absolute value of change of beam width as a function of defocus distance $$\left(\frac{dc}{dz}\right)$$

multiplied with a calibration factor (K).

Embodiment 7: The method of embodiment 5 or 6, wherein, in (a), a plurality of different focusing strengths are applied by the focusing lens (120) for varying between the plurality of different defocus distances, and an image is taken at each of the plurality of different focusing strengths.

Embodiment 8: The method of embodiment 7, wherein a defocus distance variation as a function of focusing strength variation of the focusing lens (120) is known or is determined in a preceding calibration.

Embodiment 9: The method of embodiment 5 or 6, wherein, in (a), a sample stage (108) is moved relative to the focusing lens (120) along an optical axis (A) for varying between the plurality of different defocus distances, and an image is taken at each of the plurality of different defocus distances.

Embodiment 10: The method of any of embodiments 5 to 9, wherein at least one image of the plurality of images is taken at an overfocus distance and at least one image of the plurality of images is taken at an underfocus distance.

Embodiment 11: The method of any of embodiments 1 to 10, wherein, in (b), retrieving the one or more beam cross sections ($g_{1...N}$) from the one or more images ($h_{1...N}$) comprises dividing the one or more images in Fourier space ($H_{1...N}$) by a focus image of the sample in Fourier space ($H_f$).

Embodiment 12: The method of embodiment 11, wherein retrieving the one or more beam cross sections ($g_{1...N}$) from the one or more images ($h_{1...N}$) further comprises at least one of a multiplication with an adaptive filter term ($G_{1...N}^{Filter}$) and a multiplication with a focus beam cross section in Fourier space ($G_f$).

Embodiment 13: The method of any of embodiments 1 to 12, wherein each of the one or more beam widths ($c_{1...N}$) is determined in two or more directions, particularly as a function of azimuthal angle (($c_{1...N}$)($\theta$)).

Embodiment 14: The method of embodiment 13, wherein the at least one beam convergence value comprises a first beam convergence value of the charged particle beam at a first azimuthal angle ($\theta x$) and a second beam convergence value of the charged particle beam at a second azimuthal angle ($\theta y$), particularly wherein the at least one beam convergence value is calculated as a function of the azimuthal angle.

Embodiment 15: The method of embodiment 14, wherein a numerical aperture (NA($\theta$)) of the charged particle beam as a function of the azimuthal angle is calculated from the at least one beam convergence value as a function of the azimuthal angle.

Embodiment 16: The method of any of embodiments 1 to 15, further comprising at least one or more of the following: displaying a three-dimensional model of the charged particle beam; displaying one or more two-dimensional representations of the charged particle beam in one or more selected azimuthal planes; displaying one or more one-dimensional representations of a beam width of the charged particle beam as a function of the defocus distance; and displaying a numerical aperture of the charged particle beam as a function of the azimuthal angle.

Embodiment 17: The method of any of embodiments 1 to 16, further comprising modifying at least one beam influencing element based on the at least one beam convergence value for tailoring the charged particle beam.

Embodiment 18: The method of any of embodiments 1 to 17, further comprising determining one or more beam aberration coefficients of the charged particle beam by an iterative fitting routine that uses the at least one beam convergence value as an input parameter.

Embodiment 19: A charged particle beam system, comprising: a charged particle source (105) for emitting a charged particle beam (11) propagating along an optical axis (A); a sample stage (108); a focusing lens (120) for focusing the charged particle beam toward a sample (10) placed on the sample stage (108); a charged particle detector (118) for detecting signal particles emitted from the sample; and a processor and a memory storing instructions that, when executed by the processor, cause the charged particle beam system to perform the method of any of the above embodiments.

Embodiment 20: A charged particle beam system (100), comprising: a charged particle source (105) for emitting a charged particle beam (11) propagating along an optical axis (A); a sample stage (108); a focusing lens (120) for focusing the charged particle beam toward a sample (10) placed on the sample stage; a charged particle detector (118) for detecting signal particles emitted from the sample; and a processor and a memory storing instructions that, when executed by the processor, cause the charged particle beam system: (x1) to retrieve one or more beam cross sections $(g_{1...N})$ from one or more images $(h_{1...N})$ of the sample taken at one or more defocus distances $(z_{1...N})$; (x2) to determine one or more beam widths $(c_{1...N})$ from the one or more beam cross sections $(g_{1...N})$; and (x3) to calculate at least one beam convergence value based on the one or more beam widths $(c_{1...N})$ and the one or more defocus distances $(z_{1...N})$. The charged particle beam system (100) may further be configured for the method of any of the embodiments described above.

While the foregoing is directed to embodiments, other and further embodiments may be devised without departing from the basic scope thereof, and the scope thereof is determined by the claims that follow.

The invention claimed is:

1. A method of determining a beam convergence of a charged particle beam focused by a focusing lens toward a sample in a charged particle beam system, comprising
(a) taking one or more images of the sample when the sample is arranged at one or more defocus distances from a respective beam focus of the charged particle beam;
(b) retrieving one or more beam cross sections from the one or more images;
(c) determining one or more beam widths from the one or more beam cross sections; and
(d) calculating at least one beam convergence value based on the one or more beam widths and the one or more defocus distances.

2. The method of claim 1, wherein the one or more defocus distances at which the one or more images are taken, or differences between the one or more defocus distances, are known in absolute values, and said absolute values are used for calculating the at least one beam convergence value in (d).

3. The method of claim 1, wherein the at least one beam convergence value comprises at least one of a change of beam width as a function of defocus distance, a beam convergence angle, and a numerical aperture of the charged particle beam.

4. The method of claim 1, wherein the at least one beam convergence value comprises a numerical aperture of the charged particle beam.

5. The method of claim 1, wherein
in (a), a plurality of images are taken when the sample is arranged at a plurality of different defocus distances;
in (b), a plurality of beam cross sections are retrieved from the plurality of images;
in (c), a plurality of beam widths are determined from the plurality of beam cross sections; and
in (d), the at least one beam convergence value is calculated based on the plurality of beam widths and the plurality of defocus distances.

6. The method of claim 5, wherein a numerical aperture of the charged particle beam is calculated based on an average change of beam width as a function of defocus distance and a calibration factor.

7. The method of claim 5, wherein, in (a), a plurality of different focusing strengths are applied by the focusing lens for varying between the plurality of different defocus distances, and an image is taken at each of the plurality of different focusing strengths.

8. The method of claim 7, wherein a defocus distance variation as a function of focusing strength variation of the focusing lens is known or is determined in a preceding calibration.

9. The method of claim 5, wherein, in (a), a sample stage is moved relative to the focusing lens along an optical axis for varying between the plurality of different defocus distances, and an image is taken at each of the plurality of different defocus distances.

10. The method of claim 5, wherein at least one image of the plurality of images is taken at an overfocus distance and at least one image of the plurality of images is taken at an underfocus distance.

11. The method of claim 1, wherein, in (b), retrieving the one or more beam cross sections from the one or more images comprises dividing the one or more images in Fourier space by a focus image of the sample in Fourier space.

12. The method of claim 11, wherein retrieving the one or more beam cross sections from the one or more images further comprises at least one of a multiplication with an adaptive filter term and a multiplication with a focus beam cross section in Fourier space.

13. The method of claim 1, wherein each of the one or more beam widths is determined at two or more azimuthal angles, particularly as a function of azimuthal angle.

14. The method of claim 13, wherein the at least one beam convergence value comprises a first beam convergence value of the charged particle beam at a first azimuthal angle and a second beam convergence value of the charged particle beam at a second azimuthal angle, particularly wherein the at least one beam convergence value is calculated as a function of azimuthal angle.

15. The method of claim 13, wherein the at least one beam convergence value comprises a numerical aperture of the charged particle beam as a function of azimuthal angle.

16. The method of claim 1, further comprising at least one or more of the following:
at least one of generating and displaying a three-dimensional model of the charged particle beam;
at least one of generating and displaying one or more two-dimensional representations of the charged particle beam in one or more selected azimuthal planes; and
at least one of generating and displaying one or more one-dimensional representations of a beam width of the charged particle beam as a function of defocus distance.

17. The method of claim 1, further comprising modifying at least one beam influencing element based on the at least one beam convergence value for tailoring the charged particle beam.

18. The method of claim 1, further comprising determining one or more beam aberration coefficients of the charged particle beam by an iterative fitting routine that uses the at least one beam convergence value as an input parameter.

19. A charged particle beam system, comprising:
a charged particle source for emitting a charged particle beam propagating along an optical axis;
a sample stage;
a focusing lens for focusing the charged particle beam toward a sample placed on the sample stage;
a charged particle detector for detecting signal particles emitted from the sample; and
a processor and a memory storing instructions that, when executed by the processor, cause the charged particle beam system to perform the method of claim 1.

20. A charged particle beam system, comprising:
a charged particle source for emitting a charged particle beam propagating along an optical axis;
a sample stage;
a focusing lens for focusing the charged particle beam toward a sample placed on the sample stage;

a charged particle detector for detecting signal particles emitted from the sample; and a processor and a memory storing instructions that, when executed by the processor, cause the charged particle beam system (x1) to retrieve one or more beam cross sections from one or more images of the sample taken at one or more defocus distances;

(x2) to determine one or more beam widths from the one or more beam cross sections; and (x3) to calculate at least one beam convergence value based on the one or more beam widths and the one or more defocus distances.

\* \* \* \* \*